United States Patent
Rathmell et al.

(10) Patent No.: US 6,774,377 B1
(45) Date of Patent: Aug. 10, 2004

(54) ELECTROSTATIC PARALLELIZING LENS FOR ION BEAMS

(75) Inventors: Robert D. Rathmell, Murphy, TX (US); Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/607,239

(22) Filed: Jun. 26, 2003

(51) Int. Cl.$^7$ ............................................. H01J 37/317
(52) U.S. Cl. .............................. 250/492.21; 250/396 R
(58) Field of Search ......................... 250/492.21, 396 R

(56) References Cited

U.S. PATENT DOCUMENTS 5,091,655 A   2/1992 Dykstra et al.
5,177,366 A * 1/1993 King et al. ............... 250/492.2

OTHER PUBLICATIONS

N. Nagai, T. Kawai, M. Nogami, T. Shin'yama, T. Yuasas, Y. Kibi, H. Kawakami, K. Nishikawa and M. Isobe *The Nissin NY–20SP Medium–Current Ion Implanter*, Nuclear Instruments and Methods in Physics Research B55 (1991) 393–397 North Holland.

* cited by examiner

Primary Examiner—Kiet T. Nguyen
(74) Attorney, Agent, or Firm—Watts Hoffman Co., LPA

(57) ABSTRACT

A lens structure for use with an ion beam implanter. The lens structure includes first and second electrodes spaced apart along a direction of ion movement. The lens structure extends on opposite sides of a beam path across a width of the ion beam for deflecting ions entering the lens structure. The lens structure include a first electrode for decelerating ions and a second electrode for accelerating the ions to cause ions entering the lens structure to exit said lens structure with approximately the same exit trajectory regardless of the trajectory ions enter the lens structure. In an alternate construction the lens structure can include a first electrode for accelerating ions and a second electrode for decelerating ions.

20 Claims, 3 Drawing Sheets

ELECTROSTATIC PARALLELIZING LENS FOR ION BEAMS

FIELD OF THE INVENTION

The present invention concerns ion beam implanters and more particularly to ion beam implanters having a lens through which ions that make up an ion beam pass to produce a controlled angle of impact between ions and a work-piece.

BACKGROUND ART

Axcelis Technologies, assignee of the present invention, sells products for treatment of silicon wafers during Integrated Circuit fabrication. One such product or tool creates an ion beam that modifies the physical properties of wafers that are placed into the ion beam. This process can be used, for example, to dope the silicon from which the untreated wafer is made to produce a semiconductor material. Controlled use of masking with resist materials prior to ion implantation as well as layering of different dopant patterns within the wafer produce an integrated circuit for use in one of a myriad of applications.

Prior art U.S. Pat. No. 5,177,366 to King et al and U.S. Pat. No. 5,091,655 to Dykstra et al. discuss methods of using two pair of electrostatic scanning electrodes to generate parallel ion beams. The '366 patent concerns an ion beam implantation system wherein an ion beam is controllably deflected from an initial trajectory as it passes through spaced parallel plates that are biased by a control circuit. Once deflected, the ion beam passes through electrodes positioned along a beam travel path that both re-deflect the once deflected ion beam and accelerate the ions to a desired final energy. Ions within the beam exit the accelerator and impact a work-piece at a uniform, controlled impact angle due to ion focusing in a scanning plane and an orthogonal cross plane.

The '655 patent relates to an ion beam that is controllably deflected from an initial trajectory as it passes through spaced parallel plates that are biased by a control circuit. Once deflected, the ion beam enters an accelerator that both re-deflects the once deflected ion beam and accelerates the ions to a desired final energy. When the beam exits the accelerator it moves along a trajectory that impacts a work-piece. Ions making up the ion beam all impact the work-piece at a uniform, controlled impact angle.

A printed publication entitled "The Nissin NH-20SP medium-current ion implanter" to Nagai et al describes a medium current ion implanter. The implanter has a pair of so-called kickback electrodes H2 that compensate for side to side scanning introduced by an initial set of electrodes; The sweep-voltage waveform applied to the H1 and H2 electrodes is generated by a digital-waveform generator, or a waveform controller.

SUMMARY OF THE INVENTION

An ion implanter includes an ion source for emitting ions generated from a source material and structure for causing ions to exit the source. A scanning electrode scans ions from side to side in a controlled manner to form an ion beam having a width. A lens structure defines a region into which the ions pass to deflect ions away from an initial trajectory downstream from the scanning electrode as they enter the lens structure.

The lens structure includes first and second electrodes spaced apart along a direction of ion movement which extends on opposite sides of a beam path across a width of the ion beam for deflecting ions entering the lens structure. In one embodiment of the lens structure, ions first encounter a first electrode for decelerating ions and then encounter a second electrode for accelerating the ions. The combined action of these electrodes causes ions entering the lens structure to exit the lens structure with approximately the same exit trajectory regardless of the trajectory of the ions as they enter the lens structure. In an alternate construction, the lens structure includes a first electrode along the beam path for accelerating ions and a second electrode downstream from the first electrode for decelerating ions. This alternative embodiment also causes ions entering the lens structure to exit the lens structure with approximately the same exit trajectory regardless of the trajectory of the ions as they enter the lens structure.

These and other objects, advantages and features of the invention are described in greater detail in conjunction with drawings which are used to describe an exemplary embodiment of the invention.

EXEMPLARY ALTERNATE EMBODIMENTS OF THE INVENTION

Figure 1:
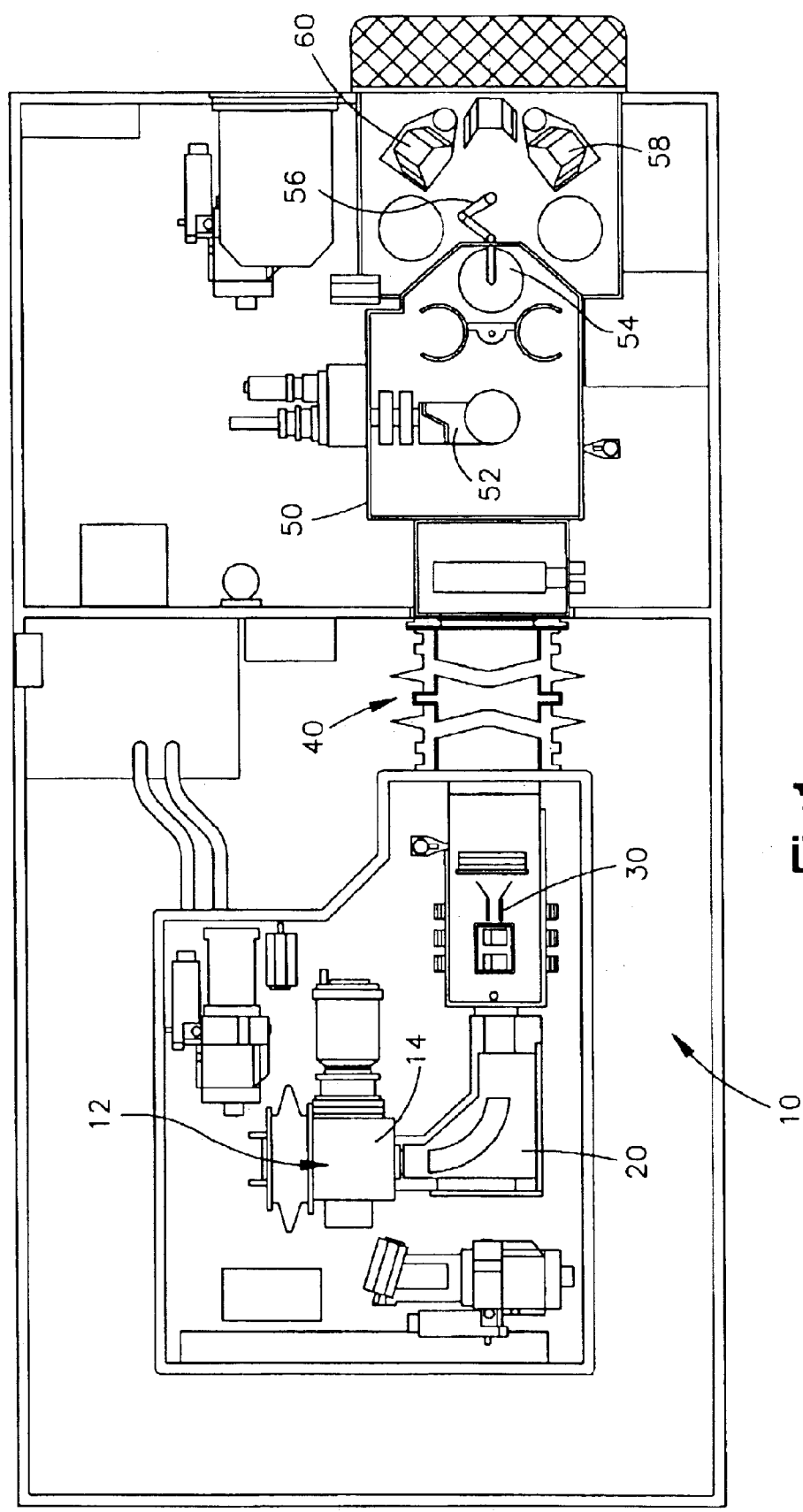
FIG. 1 is an overview schematic of an ion implanter which utilizes the present invention.

FIG. 1 is a schematic depiction of an ion implanter 10 such as Axcelis model MC-3 medium current ion implanter sold by the assignee of the present invention. Such an implanter is used for ion beam treatment of work-pieces such as silicon wafers for selective doping of those wafers. In such an implanter positive ions strike the work-piece after traversing a beam path from a source to an imploanter station. Although the ion implanter 10 depicted in FIG. 1 is a medium current ion implanter other types of implanters including high energy implanters having a linac for accelerating ions of an ion beam can utilize the invention.

The ion implanter 10 includes an ion source 12 for emitting ions generated from a source material. Typical source materials are either gases injected into a source housing 14 or solids that are vaporized to produce a plasma of ions within the source housing. As is well known in the prior art such a source 12 typically includes an extraction electrode for causing ions to exit the housing 14 along a beam path away from the source.

The implanter 10 depicted in FIG. 1 also includes a mass discriminating magnet for bending ions away from a trajectory along a path of ion travel downstream from the ion source. Different species of the same ion are produced in the source 12 and the magnet discriminates between theses species. Ions of an undesirable mass are filtered by the magnet so that ions exiting the mass analyzing magnet 20 are of a single species of the ion used in beam treatment of the workpiece.

The ion implanter 10 also includes a beam scanning structure 30 which is positioned to intercept ions subsequent to the mass discriminating magnet 20 and scan ions from side to side in a controlled manner to form an ion beam having a width. The scanning electrode 30 has two scan plates that are approximately 20 cm long and spaced apart by 2.5 cm. This separation expands outwardly to a separation of about 7.5 cm at an exit end of the two scanning electrodes. Voltages of up to +/−20 kilovolts of a controlled magnitude are applied suitable amplifiers coupled to each plate to achieve a total plate voltage separation of 40 kv.

Figure 2:
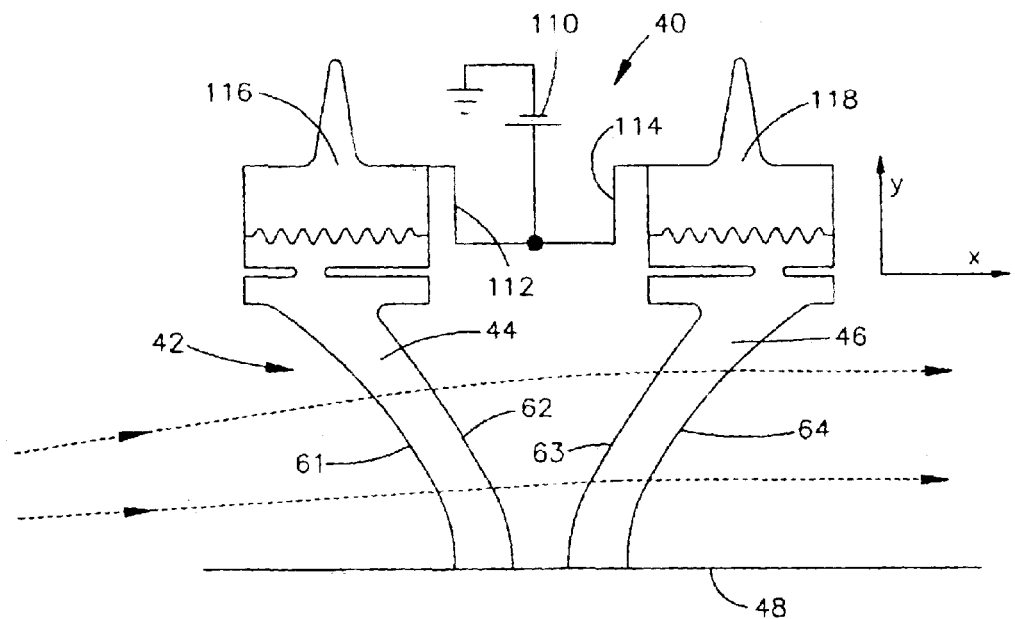
FIG. 2 is a plan view of a lens structure used in an exemplary embodiment of the invention.
Figure 3:
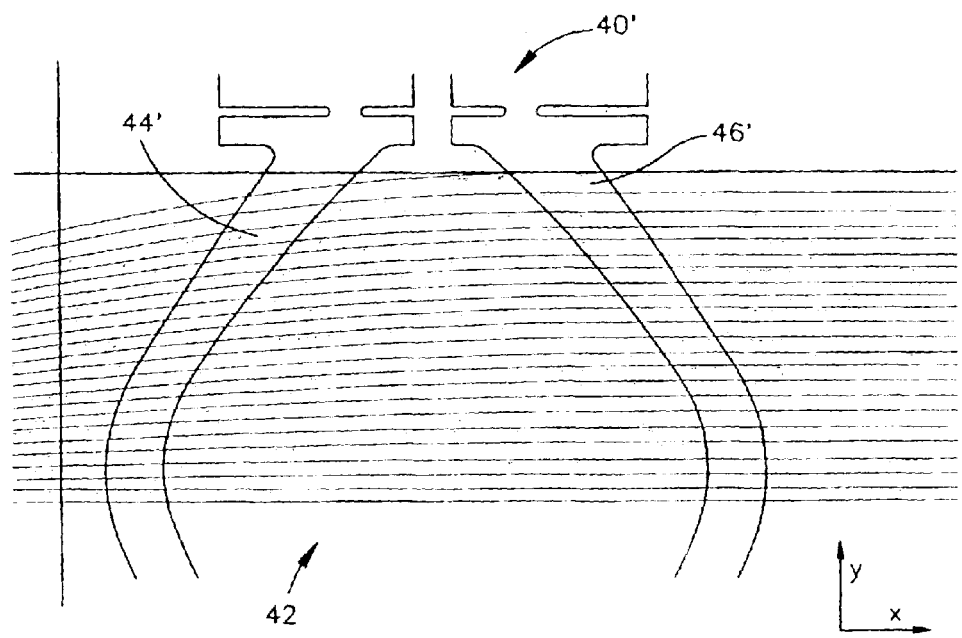
FIG. 3 is a plan view of an alternate lens structure used with an alternate exemplary embodiment of the present invention.

A lens structure 40 shown in greater detail in FIG. 2 is positioned downstream from the two scanning electrodes. The lens structure 40 accepts ions moving along diverging paths and bends them to create parallel ion trajectories for ions leaving the lens structure 40. As seen in FIGS. 2 and 3 the lens structure defines a region 42 into which the ions move after exiting a region of the scanning electrode 30. The electric field set up by the lens structure 40 deflects ions away from an initial trajectory along which the ions move as they enter the lens structure to a final trajectory.

The lens structure 40 of FIG. 2 includes first and second voltage gaps 44, 46 spaced apart along a direction of ion movement. These gaps are formed between electrodes 61 and 62 on the first gap and electrodes 63 and 64 on the second gap. These electrodes have slot-shaped openings that allow the beam to pass through them. Electrodes 62 and 63 are electrically part of the same structure and at the same potential determined by a power supply 110. Electrodes 61 and 64 may be at ground potential. In the exemplary embodiment the electrodes are constructed from aluminum. An x-y coordinate system has been illustrated in FIG. 2 to help in describing the configuration of the lens structure. Each electrode extends in the 'y' direction on opposite sides of a central beam path, 48, across a width of the scanned ion beam. In the illustrated embodiment each of the electrodes extends in the z direction above and below the scan plane (the plane of the paper). A slot-shaped opening (narrow in z and wide in y) in the electrodes allows the scanned beam to pass through the four electrodes. The electrodes 61–64 are symmetric about a beam centerline 48. The lens structure of FIG. 2 includes a first gap 44 for decelerating ions and a second gap 46 for accelerating the ions. The combined action of the electric fields set up by the four electrodes causes ions entering the lens structure 40 to exit the lens structure so that all trajectories are generally parallel to the central axis 48.

The lens structure 40' of FIG. 3 includes first and second voltage gap 44', 46' spaced apart along a direction of ion movement. Each gap extends on opposite sides of a beam path across a width of the ion beam for deflecting ions entering the lens structure. The lens structure of FIG. 3 includes a first gap 44' for accelerating ions and a second gap 46' for decelerating the ions. In this embodiment the grounded electrode of the gap 44' is past by ions in the beam after they encounter the energized electrode so that there is a component of the positive electric field (for accelerating ions) in the postive 'x' direction. The combined action of the electric fields set up by the two gaps causes ions entering the lens structure 40 to exit the lens structure approximately parallel to the central ray, 48 if the incident trajectories originate at the approximate location of the scan vertex Subsequent to leaving the lens structures 40, 40' of FIGS. 2 and 3, the ions that make up the beam, are moving in generally parallel directions and enter an ion implantation chamber 50. Enclosed within the ion implantation chamber 50 is a wafer support 52. Wafers are inserted into the chamber 52 by means of a load lock 54. Outside the chamber 50 the wafers are manipulated by a robot 56 which extracts untreated wafers from a storage cassette 58 and returns treated wafers to a second cassette 60 or alternatively can return the treated wafers from the same cassette from which they were withdrawn.

In the embodiment of FIG. 2, the first electrode or entrance electrode creates a first region of an electric field for ions entering the lens structure. The entrance electrode is concave as seen from a region of ions entering the lens. The second electrode or exit electrode creates a second electric field for ions that have passed through the entrance electrode. The exit electrode is convex as seen from a region of bounded by the entrance electrode.

The lens structure 40 changes the angle at which the ions leave the structure without changing the beam energy. Each of the electrodes 62, 63 is coupled to a common power supply 110 having an output coupled to conductors 112, 114 that pass through insulators 116, 118 that support the electrodes 62, 63 relative to the beam and are coupled to the electrodes 62, 63, for electrically energizing the electrodes. The lens structure 40 is capable of correcting scan angles of scanned 600 keV beams with application of d.c. as from the power supply of less than 150 kV. In the illustrated embodiment of the invention, a distance from the center of the scanning structure to the first or entrance electrode is approximately 97 cm. The shape of the two gaps 44, 46 is roughly parabolic and approximates the shape of two thin lenses of 2*S focal length, where S is the distance to the scan vertex, 97 cm for the first electrode 62 in this example. The ideal shape of the decelerating and accelerating gaps formed by the electrodes 61, 62 and 63, 64 is subject to electrostatic modeling of fields and trajectories, to achieve the best correction of beam direction. The spacing along the beam centerline is approximately 5 cm separation of electrodes in each gap and with approximately 10 cm between electrodes 62 and 63 at the centerline.

A lens electrode voltage of 117 kV is suitable for a 600 keV beam. For the deceleration gap, $E_p=E_{in}-R*E_{in}$, where $E_p$ is the energy between gaps and $R*E_{in}$, is the energy change after passing through the gap, R=0.195=117/600 in this example. For the accelerating gap, Ein=Ep+R*Ein. The path length through the lens structure from a point co-incident with a leading edge of the electrode 61 to the trailing edge of the electrode 64 varies from between 25 and 43 centimeters depending on the 'y' position of the ion within the beam. The vertical opening in the z direction formed by the electrodes is approximately 5 cm. A suppressor, (not shown), is needed on the entrance and ouput of scan plates and lens structure to keep positive potentials applied to these devices from extracting electrons from the ion beam, which would lead to increased space charge effects.

In the embodiment of FIG. 3, the first electrode or entrance electrode 62 in combination with the grounded electrode 61 creates a first region of electric field for ions entering the lens structure. The entrance electrode is convex as seen from a region of ions entering the lens. The second electrode 63 or exit electrode creates a second region of electric field for ions that have passed through the entrance electrode. The exit electrode is concave as seen from a region of bounded by the entrance electrode.

It should be noted that it is possible to use two or more assemblies such as FIG. 1 or 2 in series to achieve angle correction with smaller corrections occurring at each gap (with a smaller voltage on the gap), thereby achieving parallel trajectories for higher energy beams with modest voltages on, the lens structure.

Figure 4:
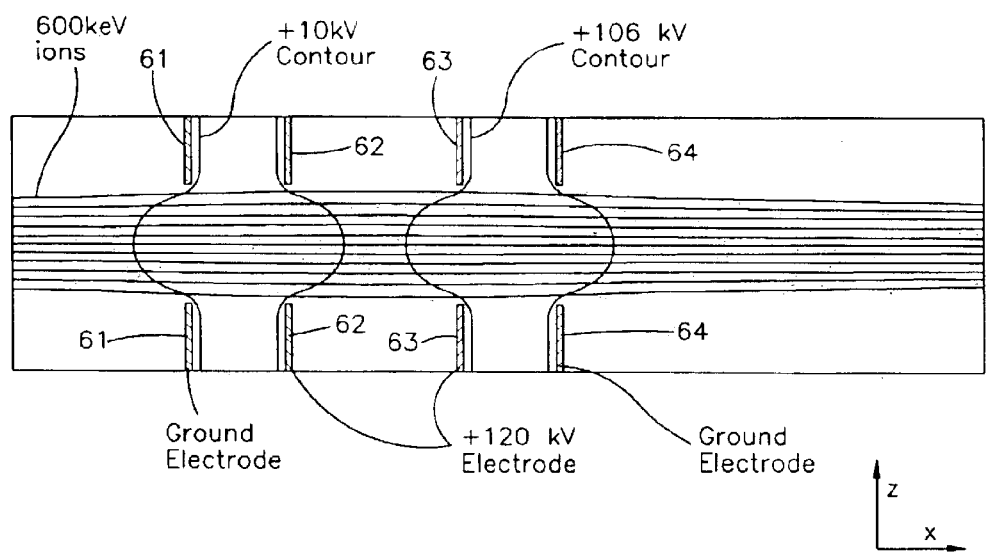
FIG. 4 is a section view of the lens structure of FIG. 2 showing a vertical focusing effect of the lens structure.

It should also be noted as the ion beam passes through these electrodes it will experience focusing in the plane orthogonal to the scan plane due to the fringe fields of the electrodes. See FIG. 4. The focal length is determined by the voltage on the gap relative to the beam energy, the height of the opening (in z), and the width of the gap (along the direction of travel, x). Electrostatic modeling of the structure can be used to achieve vertical focusing that is approximately the same at all positions y after the lens. It should also be noted that the vertical focusing will occur for gaps in which electrodes 61, 62 and 63, 64 are substantially parallel to each other. This would produce a lens which has vertical focusing for a scanned beam or a ribbon beam.

Each of the two alternate embodiments has been depicted with two energized electrodes and two grounded electrodes that are positioned along the beam path of travel to form an accelerating and a decelerating gap through which ions pass. It is also possible to use more electrodes at lower voltages to create more than two gaps. Thus, for example the structure could be implemented by an electrode of lower voltage that defines an accelerating gap followed immediately along the beam path by an electrode that defines a decelerating gap followed by a second accerlating gap and then a second decelerating gap that are implemented with appropriate electrodes of a similar parabolic shape. It is the intent that although an exemplary embodiment of the invention has been described with a degree of particularity, it is the intent that the invention include all modifications and alterations from the disclosed exemplary design, falling within the spirit or scope of the appended claims.

What is claimed is:

1. Ion implantation apparatus comprising:
   an ion source for emitting ions generated from a source material;
   a mass discriminating magnet for bending ions away from a trajectory along a path of ion travel downstream from the ion source;
   a scanning electrode positioned to intercept ions subsequent to the mass discriminating magnet to scan ions from side to side in a controlled manner to form an ion beam having a width; and
   a lens structure which defines a region into which the ions pass for deflecting ions away from an initial trajectory downstream from the scanning electrode as they enter the lens structure; said lens structure including first and second electrodes spaced apart along a direction of ion movement which extends on opposite sides of a beam path across a width of the ion beam for deflecting ions entering the lens structure; said lens structure including one electrode for accelerating ions and one electrode for decelerating said ions to cause ions entering the lens structure to exit said lens structure with approximately the same exit trajectory regardless of the trajectory ions enter the lens structure.

2. The Apparatus of claim 1 additionally comprising a power supply for applying a static voltage to each of the first and second electrodes.

3. The apparatus of claim 2 wherein the power supply supplies the same voltage to each electrode.

4. The apparatus of claim 1 wherein the first electrode comprises an entrance electrode for creating a first region of electric field for ions entering the lens structure and wherein the entrance electrode is concave as seen from a region of ions entering the lens and further wherein said second electrode comprises an exit electrode for creating a second region of electric field for ions that have passed through the entrance electrode and wherein the exit electrode is convex as seen from a region of bounded by the entrance electrode.

5. The apparatus of claim 1 wherein the first electrode comprises an entrance electrode for creating a first region of electric field for ions entering the lens structure and wherein the entrance electrode is convex as seen from a region of ions entering the lens and further wherein said second electrode comprises an exit electrode for creating a second region of electric field for ions, that have passed through the entrance electrode and wherein the exit electrode is concave as seen from a region of bounded by the entrance electrode.

6. The apparatus of claim 1 wherein a first electrode encountered by ions moving along an ion beam path is an accelerating electrode and a second electrode encountered by the ions is a decelerating electrode.

7. The apparatus of claim 1 wherein a first electrode encountered by ions moving along an ion beam path is an decelerating electrode and a second electrode encountered by the ions is a accelerating electrode.

8. The apparatus of claim 1 wherein the first and second electrodes are positioned in relation to first and second fixed, lower potential electrodes spaced from the first electrode and the second electrode to create first and second electric field defining gaps through which the ions move.

9. For use with an ion implanter having ion beam that is deflected from side to side before treating a workpiece, a lens structure which defines a region into which the ions pass for deflecting ions away from an initial trajectory as they enter the lens structure; said lens structure including a first energized electrode and a second energized electrode spaced apart along a direction of ion movement which extends on opposite sides of a beam path across a width of the ion beam for deflecting ions entering the lens structure; wherein one of said first energized electrode and second energized electrode accelerates ions and wherein a different electrode of said first energized electrode and said second energized electrode decelerates said ions to cause ions entering the lens structure to exit said lens structure with approximately the same exit trajectory regardless of the trajectory ions enter the lens structure.

10. The lens structure of claim 9 additionally comprising first and second reference electrodes maintained at a lower potential than the first energized and the second energized electrodes and spaced from the energized electrodes to create electric field defining gaps.

11. The lens structure of claim 9 comprising a power supply for energizing the first energized electrode and the second energized electrode to the same electric potential.

12. A process for forming an ion beam for use with an ion implantater comprising:
    accelerating ions created away from a source material to create an ion beam;
    scanning ions in said beam from side to side in a controlled manner to form a thin ion beam having a width; and
    deflecting ions that make up the thin ion beam away from an initial trajectory as they enter a deflection region by positioning first and second energized electrodes in spaced apart relation along a direction of ion movement to form a lens and energizing the first and second energized electrodes thereby creating an electric field to deflect ions entering the deflection region; wherein a field created by one electrode of said first and second energized electrodes accelerates ions and a field created by one electrode of said first and second energized electrodes decelerates ions to cause ions entering the deflection region to exit said deflection region with approximately the same exit trajectory regardless of the initital trajectory the ions enter the deflection region.

13. The process of claim 12 wherein the first and second energized electrodes are curved in a direction across the width of the thin beam to create a non-uniform electric field across the width of said beam.

14. The process of claim 12 additionally comprising positioning first and second reference electrodes positioned in relation to each of said first and second energized electrodes to create a gap for accelerating or decelerating ions as they remove through the gap.

15. The process of claim 14 wherein the first and second energized electrodes are energized to the same static electric potential for creating accelerating and decelerating fields in said gaps.

16. The process of claim 14 wherein relative biasing between the first and second energized electrodes arid the first and second reference electrodes is controlled so that ions experience first an acceleration and subsequently a deceleration in said gaps.

17. The process of claim 14 wherein relative biasing between the first and second energized electrodes and the first and second reference electrodes is controlled so that ions experience first a deceleration and subsequently an acceleration in said gaps.

18. The process of claim 12 additionally comprising placing additional energized electrodes along an ion beam path for accelerating and decelerating ions in the ion beam.

19. The process of claim 18 wherein each of the first, second and additional energized electrodes has an associated reference electrode which define an associated gap through which ions pass.

20. The process of claim 18 wherein the additional energized electrodes are configured similarly with respect to the ion beam to the first and second energized electrodes to provide a plurality of series configured lens sections and wherein energizing voltages coupled to the additional as well as the first and second energized electrodes are reduced from voltage levels needed for a single lens section having only said first and second energized electrodes.

* * * * *